United States Patent
Trüssel et al.

(10) Patent No.: US 7,651,339 B2
(45) Date of Patent: Jan. 26, 2010

(54) ELECTRICAL TERMINAL

(75) Inventors: Dominik Trüssel, Bremgarten (CH); Daniel Schneider, Otelfingen (CH)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 12/003,036

(22) Filed: Dec. 19, 2007

(65) Prior Publication Data

US 2008/0153321 A1 Jun. 26, 2008

(30) Foreign Application Priority Data

Dec. 22, 2006 (EP) .................................. 06405539

(51) Int. Cl.
*H01R 12/00* (2006.01)

(52) U.S. Cl. ...................................................... 439/68

(58) Field of Classification Search ................... 439/68, 439/69–73, 884–887, 66, 862, 78, 876
See application file for complete search history.

(56) References Cited

U.S. PATENT DOCUMENTS

| 6,604,950 | B2* | 8/2003 | Maldonado et al. | 439/66 |
| 6,752,634 | B2* | 6/2004 | Gonzalez et al. | 439/66 |
| 6,957,964 | B2* | 10/2005 | Chiang | 439/66 |
| 7,161,366 | B2* | 1/2007 | Herrick et al. | 324/754 |
| 7,361,023 | B2* | 4/2008 | Wu | 439/66 |
| 7,494,389 | B1* | 2/2009 | Essert et al. | 439/884 |
| 2003/0114023 | A1* | 6/2003 | Kung et al. | 439/68 |

FOREIGN PATENT DOCUMENTS

| DE | 34 15 446 A1 | 10/1984 |
| DE | 197 52 408 A1 | 6/1998 |
| EP | 0 316 999 A1 | 5/1989 |
| EP | 0 645 814 A2 | 3/1995 |
| EP | 0 713 124 A2 | 5/1996 |
| EP | 0 828 341 A2 | 3/1998 |
| EP | 1 316 999 A1 | 6/2003 |
| EP | 1 713 124 A2 | 10/2006 |
| JP | 9-129797 A | 5/1997 |

OTHER PUBLICATIONS

EPO Form 1507N.
EPO Form 1703.

* cited by examiner

*Primary Examiner*—Jean F Duverne
(74) *Attorney, Agent, or Firm*—Buchanan Ingersoll & Rooney PC

(57) ABSTRACT

An electrical terminal for a semiconductor module, which comprises at least one first electrical contact, a second electrical contact and a connection element, which electrically connects the at least one first contact with the second contact, is provided. The connection element comprises a springy portion with at least one bended area and a linear portion arranged between the second electrical contact and the springy portion. The at least one bended area comprises at least one diminution.

29 Claims, 4 Drawing Sheets

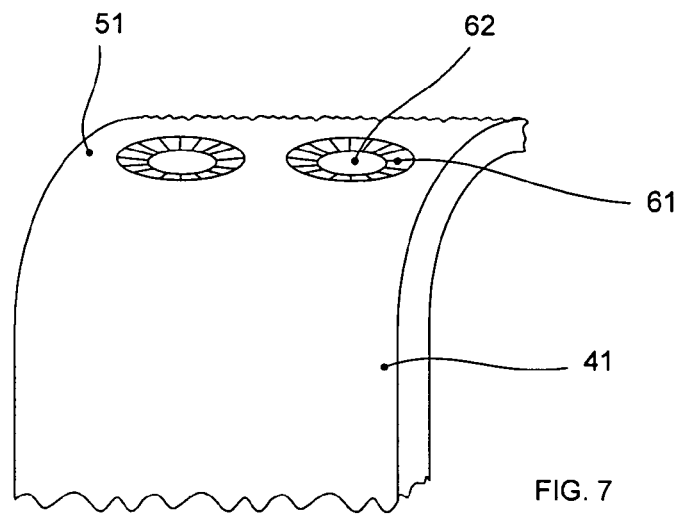
FIG. 7
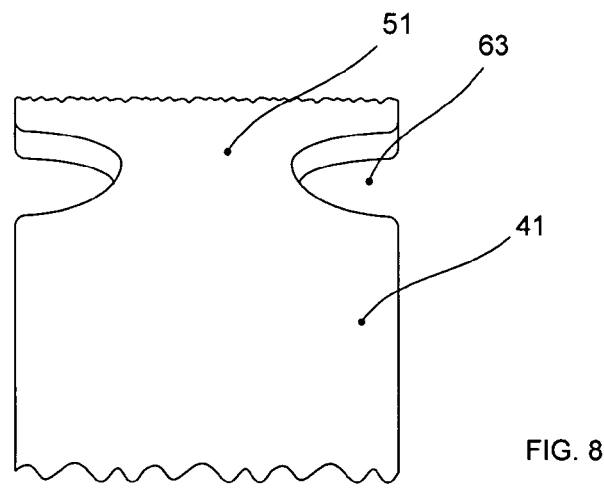
FIG. 8
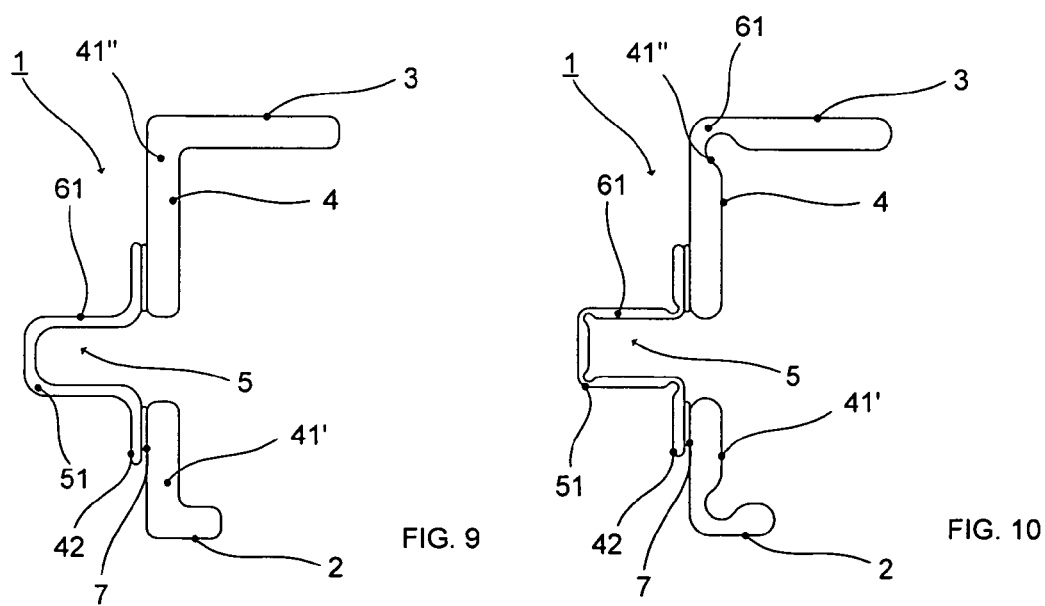
FIG. 9
FIG. 10

ELECTRICAL TERMINAL

RELATED APPLICATION

This application claims priority under 35 U.S.C. §119 to European Patent Application No. 06405539.5 filed in the European Patent Office on 22 Dec. 2006, the entire contents of which are hereby incorporated by reference in their entireties.

TECHNICAL FIELD

An electrical terminal for a power semiconductor module is disclosed.

BACKGROUND INFORMATION

EP 0 828 341 describes a power semiconductor module with a plurality of IGBTs operated in parallel and electrical terminals, by which the IGBTs can be electrically connected to a bus bar. Each IGBT with a diode or a plurality of IGBTs with diodes are arranged on a copper foiled AlN substrate, these AlN substrates being disposed on a metal substrate. IGBTs and diodes are electrically connected to emitter and collector terminals comprises an s-type bend structure in order to reduce stress on the solder layer due to thermal deformation of the module. Two or more IGBTs are connected to one main electrical terminal in that by the terminal having electrical connectors with s-type bend structures for each IGBT to be connected. The module further comprises a housing with resin walls and a resin cover. Electrical contacts of the terminals lead out of the housing through the resin cover. Due to the resin cover the positions of the terminals are fixed in vertical direction. Inside the housing the space is filled with an insulating gel resin so that the terminals can compensate for thermal expansion inside the housing.

SUMMARY

An electrical terminal for a semiconductor module is disclosed with improved mechanical flexibility to avoid stress due to thermal expansion during operation of the module, whilst the electrical terminal has good electrical properties.

An electrical terminal for a semiconductor module is disclosed, which comprises at least one first electrical contact, a second electrical contact and a connection element, which electrically connects the at least one first contact with the second contact, the connection element comprising a springy portion with at least one bended area or at least one bending and a linear portion arranged between the second electrical contact and the springy portion, characterized in that the at least one bended area or the at least one bending comprises at least one diminution.

BRIEF DESCRIPTION OF DRAWINGS

The subject matter of the disclosure will be explained in more detail in the following text with reference to the attached drawings, in which:

FIG. 7 shows a perspective view on a detail of another exemplary embodiment of the disclosure;

FIG. 8 shows a perspective view on a detail of another exemplary embodiment of the disclosure;

FIG. 9 shows a view on a profile of another exemplary embodiment of the disclosure;

FIG. 10 shows a view on a profile of another exemplary embodiment of the disclosure;

The reference symbols used in the figures and their meaning are summarized in the list of reference symbols. Generally, alike or alike-functioning parts are given the same reference symbols. The described exemplary embodiments are meant as examples and shall not confine the disclosure.

DETAILED DESCRIPTION

The inventive electrical terminal for a semiconductor module comprises at least one first electrical contact, a second electrical contact and a connection element, which electrically connects the at least one first contact with the second contact. The connection element comprises a springy portion with at least one bended area or at least one bending, in which at least one diminution is arranged, and a linear portion arranged between the second electrical contact and the springy portion.

Due to the introduction of the at least one diminution in the at least one bended area or bending the connection element has a higher mechanical flexibility, i.e. greater thermal expansion can be compensated. The at least one diminution is an attenuation line along which the connection element is locally mechanically weakened, so that it is easier to bend the plate and flexibility properties are improved, so that a electrical terminal can adapt more easily to thermal expansions within a semiconductor module. The connection element can be made of an electrically conductive plate. The at least one diminution can be formed as an area of reduced thickness compared to the thickness of the electrically conductive plate. The reduced thickness can be achieved by different ways like notches, stamping or locally removing of material of the plate, e.g. by milling. The electrical terminal can be operated at high currents, because the terminal can be made thick is the areas, which are not bended, whereas the material is made thinned in the bended areas in order to improve the mechanical flexibility locally.

The springy portions can be achieved by different profiles of bended areas. The profile can be u-shaped or s-shaped, zigzag-shaped or even just be a rounded profile. Any profile can be used as long as a springy effect is achievable by the profile. Therefore, the electrical contacts can be arranged in a vertical line, but there is also a lateral shift possible between the first and second electrical contact.

The diminution can be achieved by reducing the thickness to a defined amount, e.g., to at most 50%, in particular 30%, in particular 20% of the thickness of the electrically conductive plate. It is even possible to form the at least one diminution as a through-hole. If several diminutions are arranged in a line along the bending edge, a sort of perforation of the plate is achieved, thus giving good electrical properties whilst still mechanical stability combined with flexibility is maintained. In order to enhance the electrical properties, the diminutions are limited to the bended area, i.e. the non-bended areas have the thickness of the plate. In that case, over heat produced in the bended areas due to a high current-flow in these areas of a smaller cross-section of the plate can be transferred to the cooler non-bended areas of the plate, which have a larger cross-section and can therefore be operated at greater currents.

Figures 1, 2:
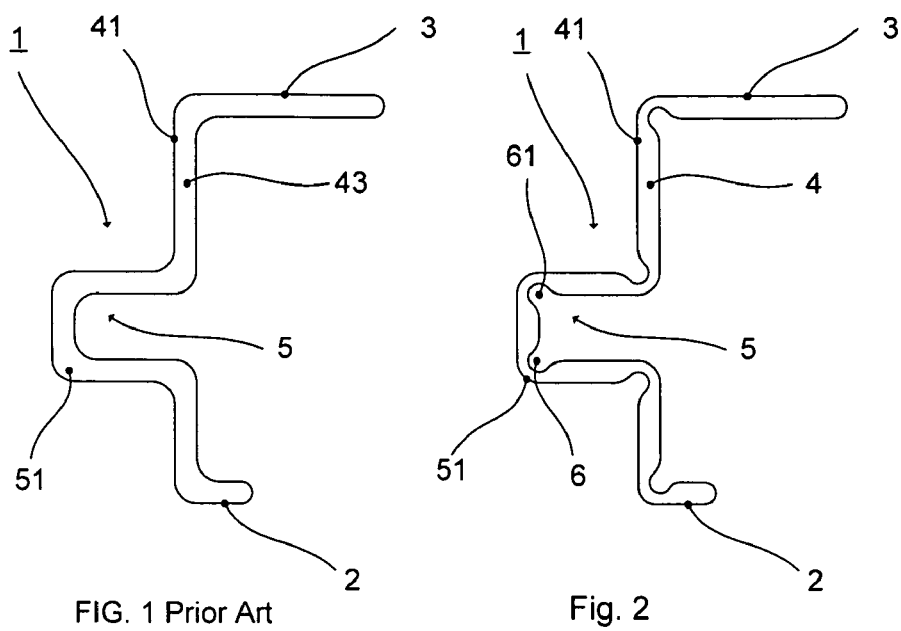
FIG. 1 shows a view on a profile of an electrical terminal according to prior art.
FIG. 2 shows a view on a profile of a first exemplary embodiment of the disclosure.

In FIG. 1 an electrical terminal according to the prior art is shown. The electrical terminal 1, which is made of a first electrically conductive plate 41, comprises a first electrical contact 2 for electrically contacting a semiconductor chip and a second electrical contact 3 for an external contact, e.g. the contact to a bus bar. Between the electrical contacts 2, 3, a connection element 4 is arranged, which comprises a springy portion 5 with at least one bended area 51. In FIG. 1 the springy portion 5 consists of bended areas 51, which have a u-shaped profile. Between the springy portion 5 and the second electrical contact 3 a linear portion 43 is arranged. This linear portion 43 is necessary to increase the distance between the electrical contacts 2, 3 and to mechanically fix the electrical terminal 1 within a semiconductor module.

FIG. 2 shows a first exemplary embodiment of an inventive electrical terminal 1. Additionally to the electrical terminal 1 as described above, the terminal according to FIG. 2 comprises at least one diminution 6 in the bended areas 51. The diminutions 6 shown in FIG. 2 have a reduced thickness compared to the thickness of the first electrically conductive plate 41. The terminal 1 as shown in FIG. 2 is made of a first electrically conductive plate 41, which is in particular made of one piece. The diminutions 6 create a mechanical attenuation line along the bending edge.

Figure 13:
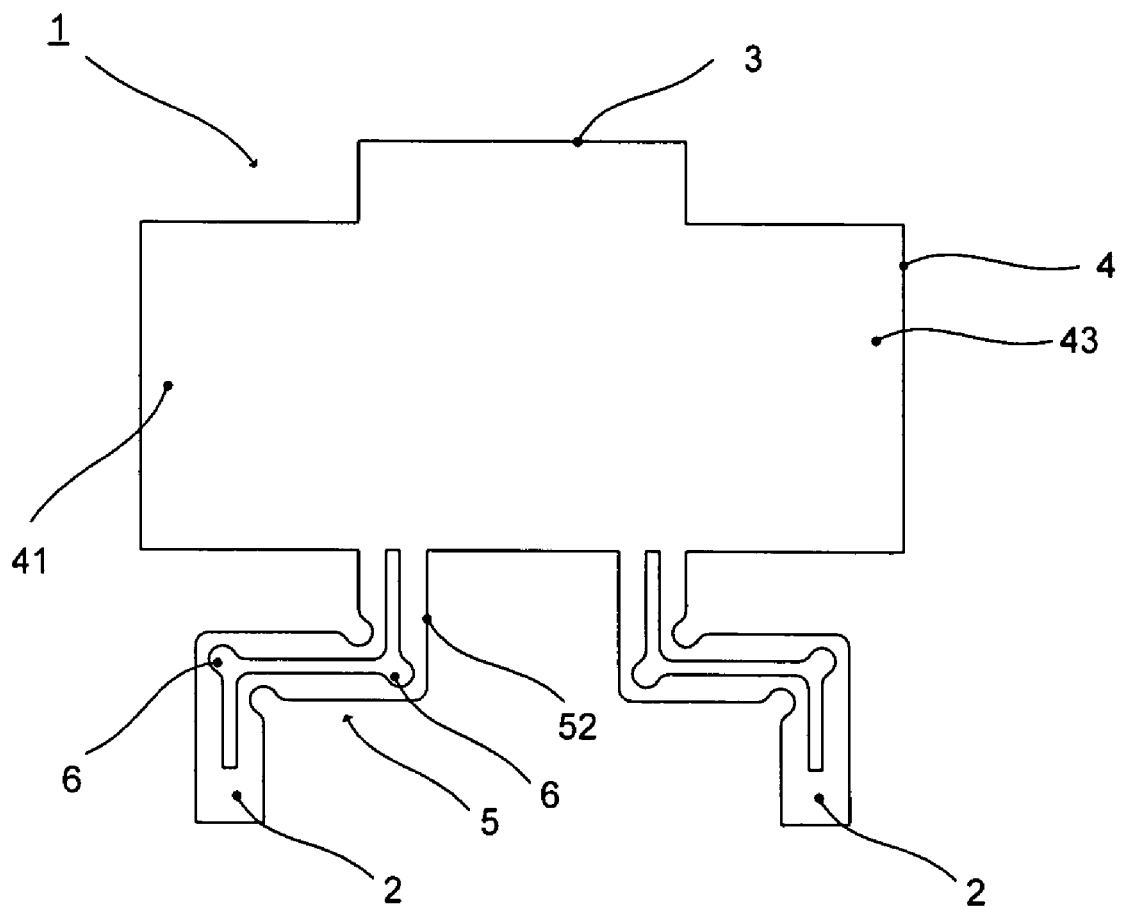
FIG. 13 shows a view on another exemplary embodiment of the disclosure.

As shown in FIG. 13, alternatively or additionally to the bended areas 51 as described above, the springy portion may comprise a bending 52, which is typically achievable by milling, cutting etc. Typically the bending is achieved by cutting or milling at least one long slit in the connection element 4 formed as a plate, the slits may be s-formed or have any other appropriate form. The width of the plate is also reduced in the area of the bendings. Thus, such a connection element is usually formed as a two dimensional element, i.e. in a planar design, though the bendings may also be bended in the third dimension, i.e. in a dimension projecting a planar plate. The first and/or second electrical contact 2, 3 may also be bended, and thereby project the plane of the planar connection element 4. By the bending, the cross-section of the connection element is reduced in the whole springy portion. Also in this case, the diminutions 6 create an additional mechanical attenuation in form of an attenuation line along the bending edge (i.e. the curvature induced by bending) as described above.

Figures 3, 4, 5:
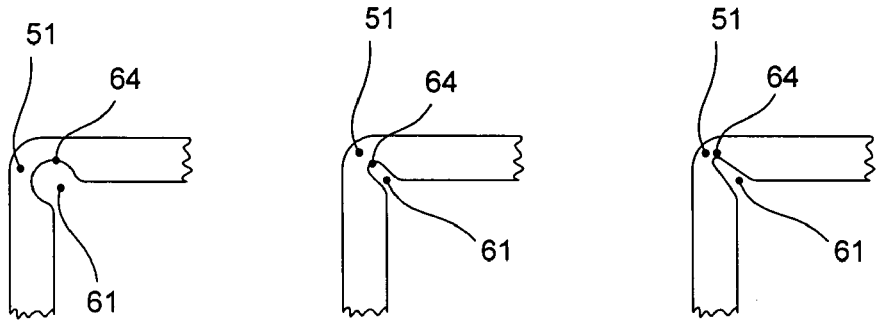
FIG. 3 shows a detail of a profile of another exemplary embodiment of the disclosure.
FIG. 4 shows a detail of a profile of another exemplary embodiment of the disclosure.
FIG. 5 shows a detail of a profile of another exemplary embodiment of the disclosure.

FIG. 3 to 5 show details of the bended area 51. In FIG. 3 the diminution 6 has a reduced thickness 61 with a rounded profile, i.e. the transition from the minimum thickness in the diminution to larger thicknesses is round. Alternatively, the profile could also be obtuse angled. In FIG. 3 it is shown that the diminution 61 is arranged on that side of the plate 41, to which the plate 41 is bended, but the diminution 61 can of course also be arranged on that outer bending side.

FIG. 4 and FIG. 5 show profiles, in which only the transition in the area of the minimum thickness is round, i.e. the peak of the diminution is round and at greater thicknesses the increase of thickness is linear. The increase in thickness of the diminution 6 can be in such a way that a slit with the walls of the slit lying parallel to each other (FIG. 4), thus resulting in a small area of reduced thickness or in a triangular profile with rounded peak, thus giving more mechanical flexibility. The rounded tip of the diminution helps to avoid a crack or breaking of the plate in the area of the breaking edge. Any other form of a diminution like e.g. notch, stamping, drilling or milling can also be used to achieve a diminution of reduced thickness.

Figure 6:
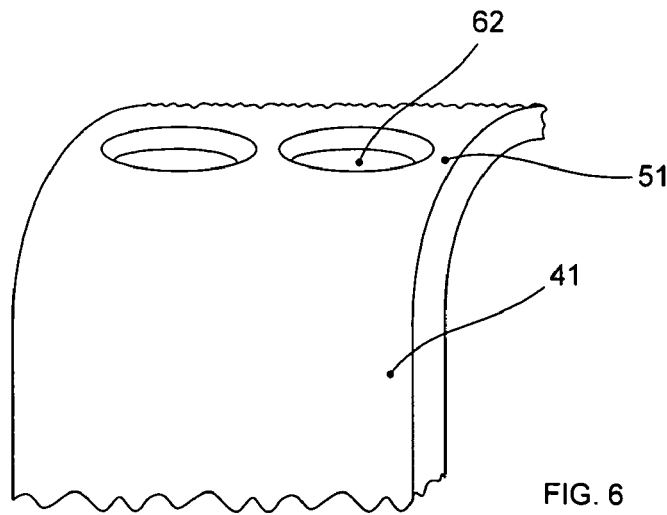
FIG. 6 shows a perspective view on a detail of another exemplary embodiment of the disclosure.

FIG. 6 shows a detail of a further exemplary embodiment with through-holes 62 as diminutions 6. Within a bended area 51 through-holes 62 are arranged in a line along the bending edge, thus resulting in a kind of perforated line, along which it is easy to bend the plate 41 and which is easy to produce. As shown in FIG. 7 the through-holes 62 can also have on one side of the plate 41 a greater opening than on the other side, i.e. the profile in the thickness direction is not rectangular, but increases to one side.

In FIG. 8 a detail of another exemplary embodiment of the disclosure is shown. The diminution has a reduced width 63 compared to the width of the connection element 4 in the non-bended areas or compared to the width of the whole connection element 4.

FIG. 9 shows another inventive electrical terminal 1, in which the connection element 4 comprises at least one first electrically conductive plate 41', 41" each with a first thickness and a second electrically conductive plate 42 with a second thickness. The second thickness is lower than any of the first thicknesses, and the second plate 42 comprises the springy portion 5. The first plates 41', 41" and the second plate 42 are firmly bonded or joined to each other by welding, soldering, gluing, screwing, riveting or the like. In FIG. 9 a first plate 41' comprises the first electrical contact 2. This first plate 41' is bonded to the second electrically conductive plate 42 comprising the springy portion 5 with diminutions 6. Another first plate 41" comprises the second electrical contact 3 and the linear portion 43. The second plate 42 is bonded to the other first plate 41', so that the second plate elastically connects the two first plates 41', 41". As shown in FIG. 10 the first and second plates 41' 41", 42 may comprise diminutions 6 in the all bended areas 51, but alternatively, diminutions 6 may also be available only in some of the bended areas 51 or in none of the bended areas 51 as it is shown in FIG. 9.

Figure 11:
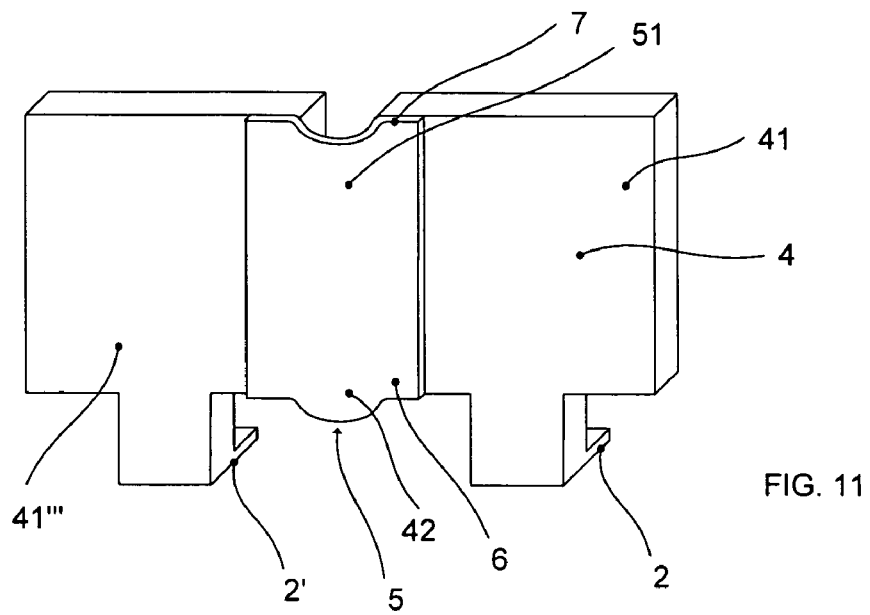
FIG. 11 shows a perspective view on another exemplary embodiment of the disclosure.

FIG. 11 shows another exemplary embodiment of the disclosure. The electrical terminal 1 comprises two first electrical contacts 2, 2', each of these contacts 2, 2' being connected to a first plate 41, 41''', each having a first thickness. Between these two first plates 41,41''' a second plate 42 with a springy portion 5 comprising bended areas 51 is arranged, which is connected to the first plates 41, 41''' by firmly bonding as described above. The second plate 42 has a second thickness, which is lower than the first thickness of any of the first plates 41, 41'''. By such an arrangement the first electrical contacts 2, 2' are electrically connected in parallel. More than two first contacts 2, 2' can be connected in parallel with springy portions 5 between two neighboured first plates and the springy portion 5 may comprise any sort of diminutions 6 described in this application. The second electrical contact is not shown in this figure for clarity reasons, but can be made as two single contacts or as a common electrical contact.

Figure 12:
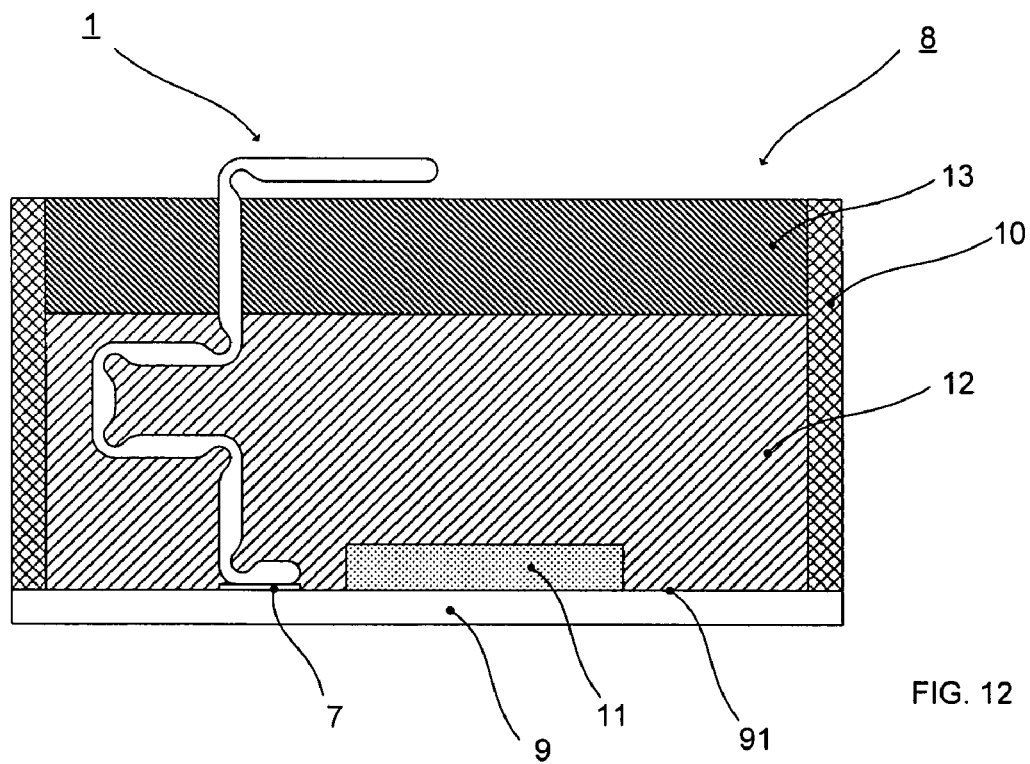
FIG. 12 shows an inventive semiconductor module.

FIG. 12 shows a semiconductor module 8 according to the disclosure. The module 8 comprises a base plate 9 with a first main side 91 and a housing 10, which surrounds the base plate 9 and which projects from the base plate 9 on the first main side 91. A semiconductor chip 11 is arranged within the housing 10 on the first main side 91 of the base plate 9 and an inventive electrical terminal 1 with a springy portion 5 comprising diminutions 6 as described above contacts the base plate 9 via the first electrical contact 2. The second electrical contact 3 projects from the housing 8 for an electrical contact to a bus bar. Typically the second electrical contact 3 is screwed to the bus bar. The first electrical contact 2 can be firmly bonded 7 to the base plate 9, in particular by welding or soldering. A further terminal can be arranged in the housing 10, one terminal for electrically contacting the emitter electrode of the chip or multitude of chips and a further terminal for electrically contacting the collector electrode of the chip or multitude of chips. Typically an electrode of the chip, which lies opposite the base plate 9, is wire bonded to an electrically conductive layer, which is connected to a first terminal. On the side of the chips facing the base plate 9, the chips are connected to another electrically conductive layer, which is in contact with a second terminal and which layer is insulated from the other electrically conductive layer.

In an exemplary embodiment, an insulating elastic layer 12 is filled into the housing 8, so that the first main side 91 of the base plate 9 and the semiconductor chip 11 are covered by the insulating elastic layer 12. Typically a silicon gel is used as insulating elastic layer 12. The bended areas 51 of the springy portion 5 of the connection element 4 are arranged within the elastic layer 12, so that the terminal 1 can compensate for thermal expansion when the module 8 is operated. Additionally, the elastic layer 12 may be covered by an insulating, hardened thermosetting plastic layer 13, in particular an epoxy resin layer. The linear portion 43 of the connection element 4 leads through the hardened layer 13, so that the terminal 1 is fixed by the hardened layer 13 and expansion of the terminal 1 can occur in that part of the terminal 1, which is arranged within the elastic layer 12. As the hardened thermosetting plastic layer 13 covers the module 8 from the side opposite the base plate 9 and the housing 10 protects the module 8 from its lateral sides, the whole module 8 is a mechanically very stable arrangement. The second electrical contact 3, which projects from the housing 8 is typically bended so that the second electrical contact 3 lies parallel to the first main side. That makes the electrical contacting of the terminals easy, in particular in case of several terminals 1, which are to be contacted by a bus bar.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Electrical Terminal
2, 2' first electrical contact
3 second electrical contact
4 connection element
41, 41', 41", 41'" first plate
42 second plate
42 linear portion
5 springy portion
51 bended area
6 diminution
61 diminution in form of reduced thickness
62 diminution in form of a through hole
63 diminution in form of reduced width
64 rounded profile
7 firm bonding
8 semiconductor module
9 base plate
91 first main side
10 housing
11 semiconductor chip
12 insulating elastic layer
13 insulating, hardened layer

What is claimed is:

1. A semiconductor module comprising:
a base plate with a first main side, a housing, which surrounds the base plate and which projects from the base plate on the first main side, a semiconductor chip being arranged within the housing on the first main side of the base plate and an electrical terminal, the electrical terminal comprising:
at least one first electrical contact, a second electrical contact and a connection element, which electrically connects the at least one first contact with the second contact, the connection element comprising a springy portion with at least one bended area or at least one bending and a linear portion arranged between the second electrical contact and the springy portion, wherein the at least one bended area or the at least one bending comprises at least one diminution; and
wherein the at least one first electrical contact contacts the base plate and the second electrical contact is arranged outside of the housing.

2. The semiconductor module according to claim 1, wherein the springy portion of the electrical terminal comprises at least one bended area and at least one bending.

3. The semiconductor module according to claim 1, wherein the springy portion of the electrical terminal comprises at least one bended area with a u-shaped, zigzag or rounded profile.

4. The semiconductor module according to claim 1, wherein the connection element of the electrical terminal comprises a first electrically conductive plate.

5. The semiconductor module according to claim 4, wherein the at least one diminution of the electrical terminal is formed as an area of reduced thickness compared to the thickness of the first electrically conductive plate.

6. A semiconductor module according to claim 5, wherein the at least one diminution of the electrical terminal has a thickness of at most 50%, in particular 30%, in particular 20% of the thickness of the first electrically conductive plate.

7. The semiconductor module according to claim 4, wherein the at least one diminution of the electrical terminal is formed as a through-hole.

8. The semiconductor module according to claim 5, wherein the at least one diminution of the electrical terminal with reduced thickness has an at least partially rounded or obtuse angled profile.

9. The semiconductor module according to claim 1, wherein the at least one diminution of the electrical terminal is formed as an area of reduced width compared to the mean width of the whole connection element.

10. The semiconductor module according to claim 9, wherein the at least one diminution of the electrical terminal has a width of at most 50%, in particular 30%, in particular 20% of the mean width of the whole connection element.

11. The semiconductor module according to claim 4, wherein the connection element of the electrical terminal is made as one piece.

12. The semiconductor module according to claim 1, wherein the connection element of the electrical terminal comprises:
at least one first electrically conductive plate with a first thickness and a second electrically conductive plate with a second thickness, the second thickness being lower than the first thickness, and in that the second plate comprises the springy portion.

13. The semiconductor module according to claim 12, wherein the at least one first plate and the second plate are firmly bonded to each other by welding, soldering or gluing.

14. A semiconductor module according to claim 1, wherein the electrical terminal comprises:
at least two first electrical contacts, which are electrically connectable in parallel via the connection element, and in that between two neighboured first electrical contacts a springy portion with at least one diminution is arranged.

15. The semiconductor module according to claim 1, wherein at least one bended area or bending is arranged between the second electrical contact and the linear portion, and in that the at least one bended area or bending comprises a diminution.

16. The semiconductor module according to claim 1, wherein the at least one first electrical contact is firmly bonded to the base plate, in particular by welding or soldering.

17. The semiconductor module according to claim 16, wherein the first main side of the base plate and the semiconductor chip are covered by an insulating elastic layer, in particular a silicon gel layer, and in that the at least one bended area or the at least one bending of the connection element is arranged within the elastic layer.

18. The semiconductor module according to claim 1, wherein the first main side of the base plate and the semiconductor chip are covered by an insulating elastic layer, in particular a silicon gel layer, and in that the at least one bended area or the at least one bending of the connection element is arranged within the elastic layer.

19. The semiconductor module according to claim 18, wherein the insulating elastic layer is covered by an insulating, hardened thermosetting plastic layer, in particular an epoxy resin layer, and in that the second electrical contact projects from the thermosetting plastic layer.

20. The semiconductor module according to claim 2, wherein the springy portion of the electrical terminal comprises at least one bended area with a u-shaped, zigzag or rounded profile.

21. The semiconductor module according to claim 3, wherein the connection element of the electrical terminal comprises a first electrically conductive plate.

22. The semiconductor module according to claim 6, wherein the at least one diminution of the electrical terminal is formed as a through-hole.

23. The semiconductor module according to claim 7, wherein the at least one diminution of the electrical terminal with reduced thickness has an at least partially rounded or obtuse angled profile.

24. The semiconductor module according to claim 8, wherein the at least one diminution of the electrical terminal is formed as an area of reduced width compared to the mean width of the whole connection element.

25. The semiconductor module according to claim 10 wherein the connection element of the electrical terminal is made as one piece.

26. The semiconductor module according to claim 10, wherein the connection element of the electrical terminal comprises at least one first electrically conductive plate with a first thickness and a second electrically conductive plate with a second thickness, the second thickness being lower than the first thickness, and in that the second plate comprises the springy portion.

27. The semiconductor module according to claim 10, wherein the electrical terminal comprises at least two first electrical contacts, which are electrically connectable in parallel via the connection element, and in that between two neighboured first electrical contacts a springy portion with at least one diminution is arranged.

28. The semiconductor module according to claim 14 wherein at least one bended area or bending of the electrical terminal is arranged between the second electrical contact and the linear portion, and in that the at least one bended area or bending comprises a diminution.

29. A semiconductor module comprising a base plate with a first main side, a housing, which surrounds the base plate and which projects from the base plate on the first main side, a semiconductor chip being arranged within the housing on the first main side of the base plate and an electrical terminal, the electrical terminal comprising:
at least one first electrical contact, a second electrical contact and a connection element, which electrically connects the at least one first contact with the second contact, the connection element comprising a springy portion with at least one bended area or at least one bending and a linear portion arranged between the second electrical contact and the springy portion, wherein the at least one bended area or the at least one bending comprises at least one diminution:
wherein at least one bended area or bending is arranged between the second electrical contact and the linear portion, and in that the at least one bended area or bending comprises a diminution; and
wherein the at least one first electrical contact contacts the base plate and the second electrical contact is arranged outside of the housing.

* * * * *